United States Patent [19]

Nakajima

[11] Patent Number: 5,321,316

[45] Date of Patent: Jun. 14, 1994

[54] LATCHING CIRCUIT WITH LOGIC OPERATION

[75] Inventor: Masaitsu Nakajima, Osaka, Japan

[73] Assignee: Matsushita Electric Industrial Co., Ltd., Osaka, Japan

[21] Appl. No.: 969,676

[22] Filed: Oct. 28, 1992

[30] Foreign Application Priority Data

Dec. 6, 1991 [JP] Japan ................... 3-322680

[51] Int. Cl.$^5$ .................. H03K 19/02; H03K 3/26
[52] U.S. Cl. ................... 307/279; 307/473; 307/481; 307/289; 307/291; 307/353
[58] Field of Search ............... 307/279, 473, 481, 289, 307/291, 353

[56] References Cited

U.S. PATENT DOCUMENTS

| | | | |
|---|---|---|---|
| 4,112,296 | 9/1978 | Heimbigner et al. | 307/353 |
| 4,974,241 | 11/1990 | McClure et al. | 307/279 |
| 5,003,513 | 3/1991 | Porter et al. | 307/279 |

*Primary Examiner*—Margaret Rose Wambach
*Attorney, Agent, or Firm*—Lowe, Price, LeBlanc & Becker

[57] ABSTRACT

A latching circuit comprises: a logic gate circuit having N inputs, such as NAND or NOR; N first switches responsive to a control signal indicative of a latching and non-latching modes for connecting N input terminals to said N inputs respectively in said non-latching mode; a signal producing circuit for producing a signal at an output thereof in response to said logic output; a second switches for connecting said output to said one input in said latching mode; (N-1) third switches responsive to said control signal for connecting N-1 inputs of said N inputs other than said one input to a logic level respectively in said latching mode, said logic level being determined such that said logic outputs is determined by a logic level of said one input in said latching mode, said signal producing circuit producing said signal such that said logic gate circuit holds said logic output in said latching mode. An AND gate and OR gate can be used also. The second and third switches can be replaced with resistive elements. All inputs of the logic circuit may be fed back to latch the output level.

24 Claims, 7 Drawing Sheets

CONT SIG 90 = H

CONT SIG 90 = L

CONT SIG 90 = H

CONT SIG 90 = L

LATCHING CIRCUIT WITH LOGIC OPERATION

BACKGROUND OF THE INVENTION

1. Field of the Invention

This invention relates to a latching circuit for latching a logic input level at its output in response to a control signal.

2. Description of the Prior Art

A latching circuit for latching a logic input level at its output in response to a control signal is known. In such a latching circuit, reduction of the number of elements included therein and high speed are required. Particularly, in the microprocessor including such latching circuits, this requirement has been grown increasingly because the operation speed of the latching circuit largely affects the operation speed of the microprocessor.

FIG. 6 is a schematic circuit diagram of a prior art latching circuit. This latching circuit is used with other logic circuit connected to its input and holds the logic level of the logic circuit at its output in response to a control signal. In FIG. 6, numeral 10 is a sample of a logic circuit, that is, a NOR gate which has two inputs and outputs a NOR logic output through NOR operation in accordance with logic levels of its inputs 60 and 70. Numeral 100 is a prior art latching circuit comprising a switching element 101, inverters 102 and 103, a tri-state inverter 104. The switching element 101 and the inverter 104 are controlled in accordance with a logic level of the control signal 90. The switching element 101 is closed when the control signal 90 is logic H. The tri-state inverter 104 is in a conduction state and outputs an inverted signal when the control signal 90 is logic L. The latching circuit 100 receives the output of the NOR gate 10 and outputs a latched signal at its output 180.

Operation of the prior art latching circuit will be described.

Given inputs are inputted into first and second inputs 60 and 70 of the NOR gate 10. The NOR gate 10 outputs a NOR logic output which is sent to the latching circuit 100. When the control signal 90 is logic H, the switching element 101 is in a conduction state, on the other hand, the tri-state inverter 104 is open. Therefore, the inputted NOR logic output is outputted at the output 180 through the switching element 101 and the inverters 102 and 103. When transition of the control signal 90 from logic H to logic L, the switching element 101 turns to a open state and the tri-state inverter 104 turns to a conduction state, so that the inverter 102 and the tri-state inverter 104 form a loop. Therefor, a bistable circuit is established. The bistable circuit maintains a level inputted therein just before transition of the control signal 90 from logic H to logic L. The maintained level at the output of the inverter 102 is outputted through the inverter 103. That is, the latching circuit 100 performs a latching operation such that it latches the output of the NOR gate 10 at its output 180 in accordance with the logic level of the control signal 90.

In the prior art latching circuit, because the latching circuit 100 is connected to the output of the logic circuit, there is a problem of decrease in operation speed due to increase in the number of circuits through which the logic signal passes. Moreover, there is also a problem of increase in the structural elements of the total circuit including the logic circuit and the latching circuit connected to the logic circuit.

SUMMARY OF THE INVENTION

The present invention has been developed in order to remove the above-described drawbacks inherent to the conventional latching circuit.

According to the present invention there is provided a latching circuit comprising: a logic operation circuit having N inputs for effecting a predetermined logic operation between the N inputs to produce a logic output, the N being a natural number more than one; N first switching elements responsive to a control signal indicative of latching and non-latching modes for connecting N input terminals to the N inputs respectively when the control signal is indicative of the non-latching mode; a signal producing circuit for producing a signal at an output thereof in response to the logic output; a second switching element for connecting the output to the above-mentioned one input when the control signal is indicative of the latching mode; and (N−1) third switching elements responsive to the control signal for connecting N−1 inputs of the N inputs other than the above-mentioned one input to a logic level respectively when the control signal is indicative of the latching mode. The logic level is determined such that the logic output is determined by a logic level of one input when the control signal is indicative of the latching mode. The signal producing circuit produces the signal such that the logic operation circuit holds the logic output when the control signal is indicative of the latching mode. The logic circuit comprises a NOR or a NAND gate. An OR gate and AND gate can be used for the logic circuit. The second and third switching elements can be replaced with resistive elements.

That is, there is also provided a latching circuit comprising: a logic operation circuit having N inputs for effecting a predetermined logic operation between the N inputs to produce a logic output, the N being a natural number more than one; N switching elements responsive to a control signal indicative of latching and non-latching modes for connecting N input terminals to the N inputs respectively; a feedback circuit having a predetermined output resistance for feeding back the logic output to one input of the N inputs; and (N−1) resistive elements for connecting (N−1) inputs of the N inputs other than the above-mentioned one input to a logic level respectively. The logic level is determined such that the logic outputs is determined by a logic level of the above-mentioned one input when the control signal is indicative of the latching mode. The feedback circuit feeds back the logic output such that the logic operation circuit holds the logic output when the control signal is indicative of the latching mode. Each of the (N−1) switching elements respectively connected to the (N−1) inputs has a larger resistance than each of the (N−1) resistive elements when the control signal is indicative of the latching mode. Each of the (N−1) switching elements has a smaller resistance than each of (N−1) resistive elements when the control signal is indicative of the non-latching mode. The output resistance is a larger than a resistance of one of the switching element connected to one input when the control signal is indicative of the non-latching mode. The logic level connected to the (N−1) inputs is that of the supply power if the logic operation circuit is NAND gate. The logic level is the ground level if the logic operation circuit is NOR gate.

According to the present invention there is further provided a latching circuit comprising: a logic operation circuit having N inputs for effecting a predetermined logic operation between the N inputs to produce a logic output, the N being a natural number more than one; N first switching elements responsive to a control signal indicative of latching and non-latching modes for connecting N input terminals to the N inputs respectively when the control signal is the non-latching mode; N resistive elements; and a feedback circuit for feeding back the logic output to the N inputs through the N resistive elements respectively such that the logic operation circuit holds the logic output when the control signal is indicative of the latching mode, the N resistive elements having larger resistances than the N first switching elements respectively when the control signal is indicative of non-latching mode.

BRIEF DESCRIPTION OF THE DRAWINGS

The object and features of the present invention will become more readily apparent from the following detailed description taken in conjunction with the accompanying drawings in which.

The same or corresponding elements or parts are designated as like references throughout the drawings.

DETAILED DESCRIPTION OF THE INVENTION

Hereinbelow will be described a first embodiment of this invention with reference to drawings.

Figure 1:
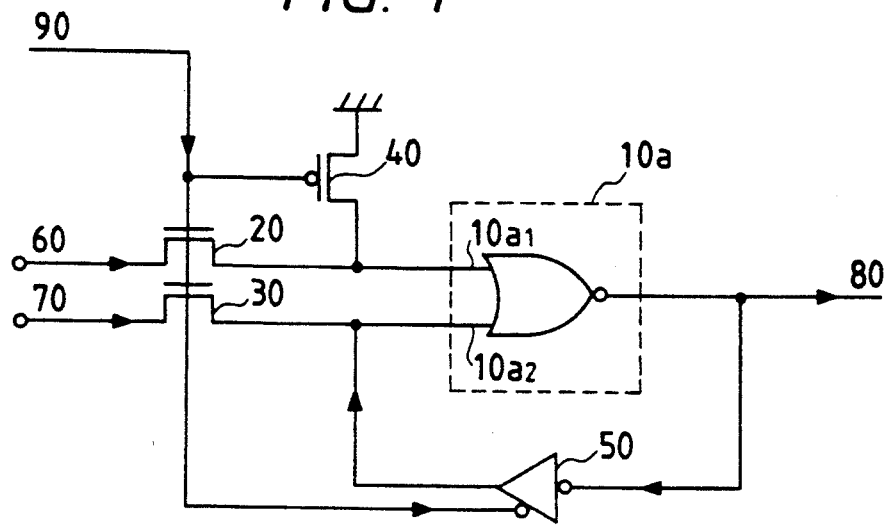
FIG. 1 is a schematic circuit diagram of a latching circuit of a first embodiment.

FIG. 1 is a schematic circuit diagram of a latching circuit of the first embodiment.

In FIG. 1, numeral $10a$ is a NOR gate for outputting a NOR operation result between input signals from first and second input terminals 60 and 70 at an output 80. Numeral 20 is a first switching element for transferring the input signal from the first input 60 to a first input of the NOR gate $10a$ in response to a control signal 90. Similarly, numeral 30 is a second switching element for transferring an input signal from the second input 70 to a second input of the NOR gate 10 in response to the control signal 90. The switching elements 20 and 30 comprises n channel EFT (field effect transistor). When the control signal 90 is logic H, these switching elements 20 and 30 are in conduction states. When the control signal 90 is logic L these switching elements 20 and 30 are open. Numeral 40 is a third switching element comprising p channel FET for conducting a ground level to the first input of the NOR gate $10a$ in response to the control signal 90. When the control signal 90 is logic H, the switching element 40 is open. When the control signal 90 is logic L the switching element 40 conducts the ground level to the first input of the NOR gate $10a$. Numeral 50 is a fourth switching element (tri-state inverter) for outputting an inverted signal of an input signal thereinto and for sending the inverted signal to the second input $10_{a2}$ of the NOR gate $10a$ when the control signal 90 is logic L and for disconnecting it from the second input $10_{a2}$ of NOR gate $10a$ when the control signal 90 is logic H.

Hereinbelow will be described operation of the first embodiment.

Figure 2A:
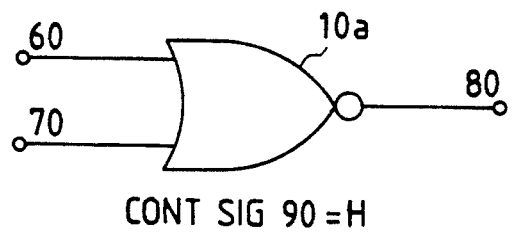
FIGS. 2A and 2B are equivalent schematic circuit diagrams of the latching circuit of the first embodiments.

FIG. 2A is an equivalent schematic circuit diagram of the latching circuit shown in the FIG. 1 when the control signal is logic H. In this condition, the latching circuit shown in FIG. 1 can be represented by the equivalent circuit shown in FIG. 2A because the first and second switching elements 20 and 30 are in the conduction state and the third and fourth switching elements 40 and 50 are in the open state. That is, the equivalent circuit shown in FIG. 2A outputs a NOR operation output at the output 80 in response to the signals from the first and second terminals 60 and 70.

Figure 2B:
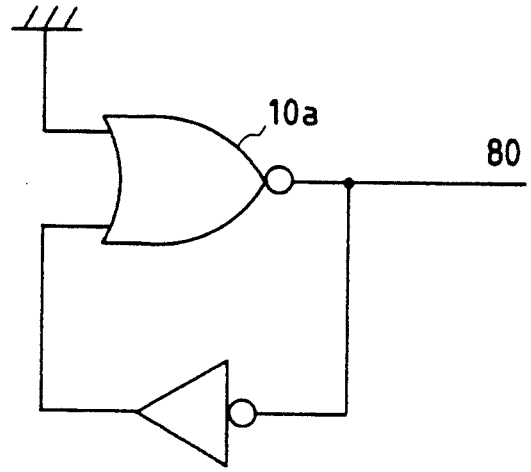

When the control signal 90 is changed to logic L, the latching circuit shown in FIG. 1 can be represented by the equivalent circuit shown in FIG. 2B because the first and second switching elements 20 and 30 are in the open state and the third and fourth switching elements 40 and 50 are in the condition state. That is, in the equivalent circuit shown in FIG. 2B, the first input of the NOR gate 10 is connected to the ground and the second input $10_{a2}$ of the NOR gate $10a$ is connected the fourth switching element 50, so that this equivalent circuit holds the result of the NAND operation at the output 80. This fact indicates that two states shown in FIGS. 2A and 2B are switched in accordance with the control signal 90. That is, there is provided a bistable circuit. Therefore, when the control signal 90 is changed into logic L, the latching circuit holds its output level which has been outputted there just before the transition of the control signal 90. That is, the latching circuit of the first embodiment effects NOR operation between the input signals from the first and second inputs 60 and 70 and latches the result of the NOR operation in response to the control signal 90.

Figure 6:
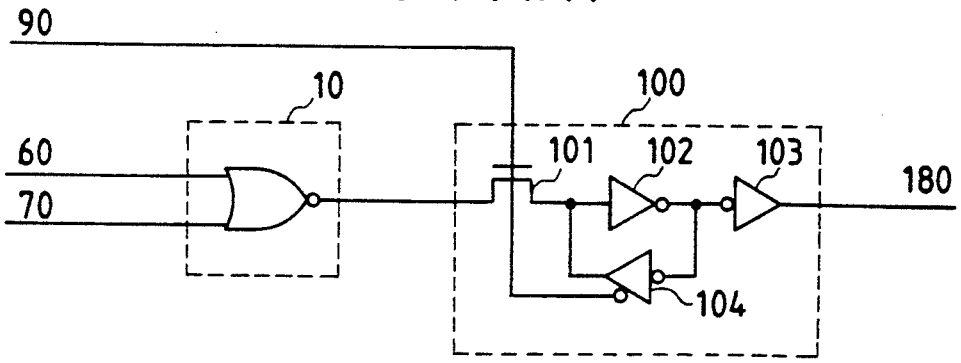
FIG. 6 is a schematic circuit diagram of a prior art latching circuit.

According to this embodiment, though the latching circuit of this embodiment has the same function with the prior art latching circuit and the NOR gate shown in FIG. 6, the number of gates through which an input signal passes is reduced from four to two in comparison with the prior art latching circuit shown in FIG. 6. Therefore, the operation speed is increased.

FIG. 1 shows a basic structure of the first embodiment. That is, the number of the input terminals is two. On the other hand, FIG. 8 shows the case of the latching circuit having N input terminals $60_1$–$60_{-n}$.

Figure 8:
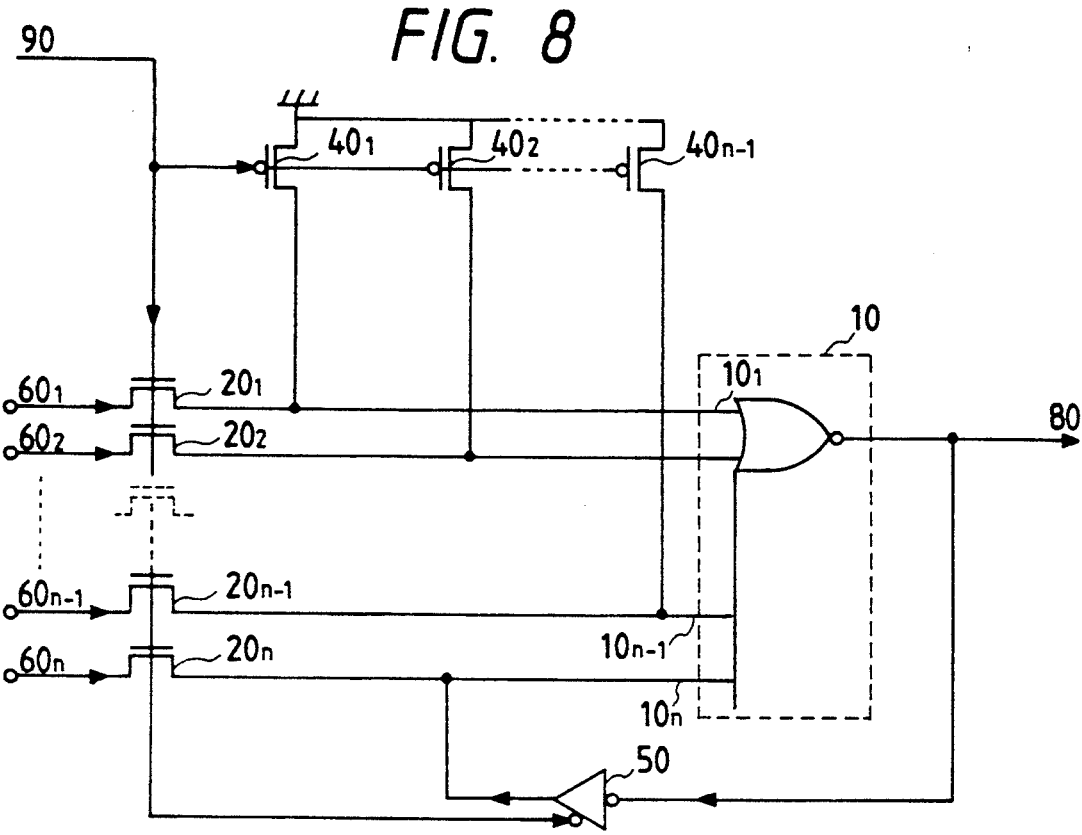
FIG. 8 is a schematic diagram showing a modification of the first embodiment.

In FIG. 8, when the control signal 90 is logic H, the NOR gate 10 effects NOR operation among inputs signals from the N input terminals $60_1$-$60_n$ because switching elements $20_1$-$20_n$ responsive to the control signal 90 are in the conduction state. When the control sign 90 is logic L, the switching elements $20_1$-$20_n$ are in the open state; switching elements $40_1$-$40_{n-1}$ responsive to the control signal 90 are in the conduction state, that is, they ground the inputs $10_1$-$10_{n-1}$; and the tri-state inverter 50 responsive to the control signal 90 feeds back the logic output 80 to the input $10_n$ of the NOR gate 10 to holds the level of the logic output 80.

Herein below will be described a second embodiment of this invention with reference to drawings.

Figure 3:
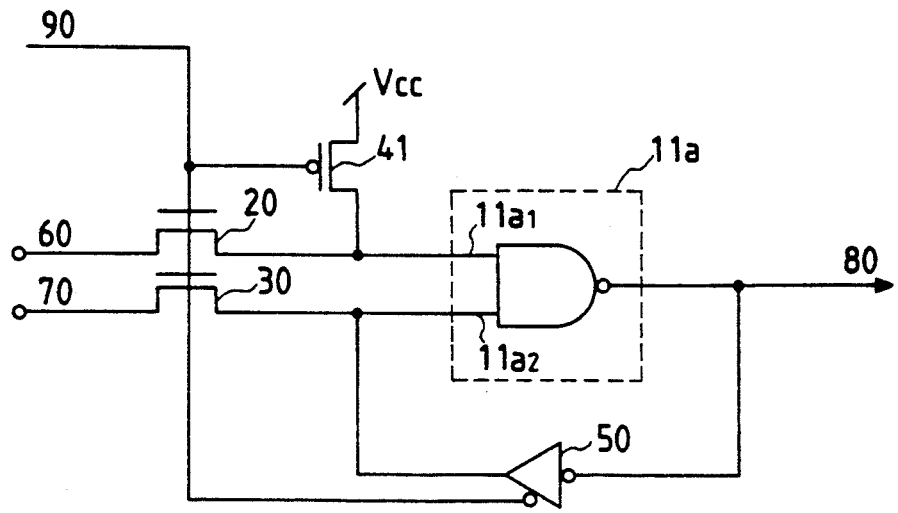
FIG. 3 is a schematic circuit diagram of a latching circuit of a second embodiment.

FIG. 3 is a schematic circuit diagram of a latching circuit of the second embodiment. The NOR gate 10a of the first embodiment is replaced with a NAND gate 11a.

In FIG. 3, the NAND gate 11 outputs a NAND operation output between first and second input signals from inputs 60 and 70 at output 80. Numeral 20 is a first switching element for transferring an input signal from the first input terminal 60 to a first input of the NAND gate 11a in response to a control signal 90. Similarly, numeral 30 is a second switching element for transferring the second input signal from the second input terminal 70 to a second input of the NAND gate 11a in response to the control signal 90. When the control signal 90 is logic H these switching elements 20 and 30 conduct their inputs to their outputs. When the control signal 90 is logic L these switching elements 20 and 30 are open. Numeral 41 is a third switching element for conducting a logic H level, namely Vcc, to the first input of the NAND gate 11a in response to the control signal 90. When the control signal 90 is logic H, the switching element 41 is open. When the control signal 90 is logic L the switching element 41 conducts the logic H level to the first input of the NAND gate 11a. Numeral 50 is a fourth switching element (tri-state inverter) for outputting an inverted signal of an input signal thereinto and for sending the inverted signal to the second input of the NAND gate 11 when the control signal 90 is logic L and for disconnecting it from the second input of NAND gate 11 when the control signal 90 is logic H. The switching elements 20 and 30 comprise n channel FETs and the switching element 41 comprises p channel FET.

Hereinbelow will be described operation of the second embodiment.

Figure 4A:
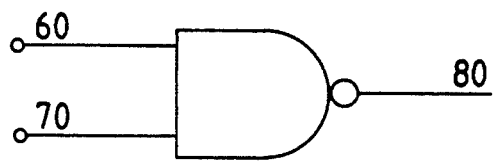
FIGS. 4A and 4B are equivalent schematic circuit diagrams of the latching circuit of the second embodiment.

FIG. 4A is an equivalent schematic circuit diagram of the latching circuit shown in the FIG. 3 when the control signal 90 is logic H. In this condition, the latching circuit shown in FIG. 3 can be represented by the equivalent circuit shown in FIG. 4A because the first and second switching elements 20 and 30 are in the conduction state and the third and fourth switching elements 41 and 50 are in the open state. That is, the equivalent circuit shown in FIG. 4A outputs a NAND operation result at the output 80 in response to the first and second inputs 60 and 70.

Figure 4B:
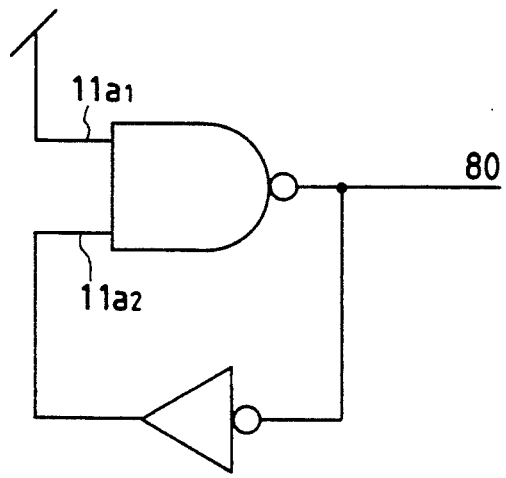

When the control signal 90 is changed to logic L, the latching circuit shown in FIG. 3 can be shown by the equivalent circuit shown in FIG. 4B because the first and second switching elements 20 and 30 are in the open state and the third and fourth switching elements 41 and 50 are in the conduction state. That is, in the equivalent circuit shown in FIG. 4B, the first input $11_{a1}$ of the NAND gate 11a is connected to the ground and the second input $11_{a2}$ of the NAND gate 11a is connected the fourth switching element 50, so that this equivalent circuit holds its the result of the NAND operation at the output 80. That is, a bistable circuit is formed. Therefore, when the control signal 90 is changed into logic L, the latching circuit holds its output level which has been outputted there just before the transition of the control signal 90. That is, the latching circuit of the second embodiment effects NAND operation between the first and second inputs 60 and 70 and latches the result of the NAND operation in response to the control signal.

FIG. 3 shows a basic structure of the second embodiment. That is, the number of the input terminals is two. On the other hand, FIG. 9 shows the case of the latching circuit having N input terminals $60_1$-$60_n$ using a NAND circuit 11.

Figure 9:
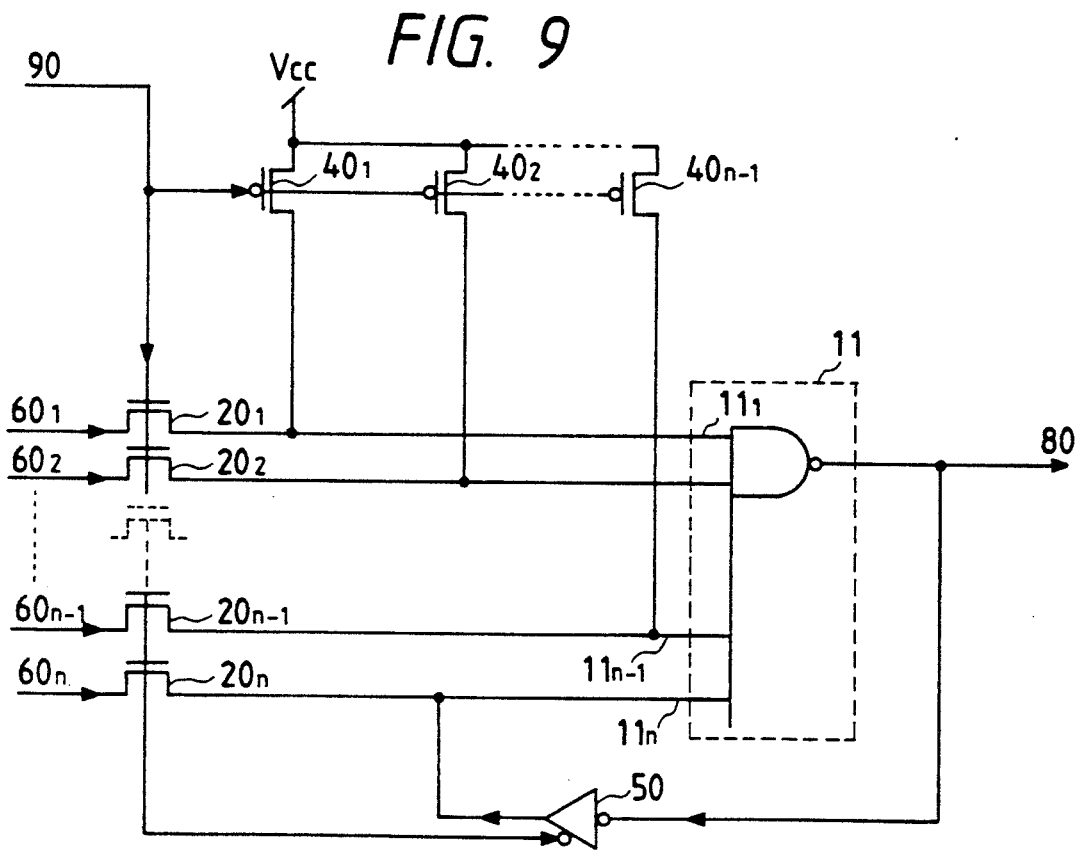
FIG. 9 is a schematic diagram showing a modification of the second embodiment.

In FIG. 9, when the control signal 90 is logic H, the NAND gate 11 effects NAND operation among inputs signals from the N input terminals $60_1$-$60_n$ because switching elements $20_1$-$20_n$ responsive to the control signal 90 are in the conduction state. When the control signal 90 is logic L, the switching elements $20_1$-$20_n$ is in the open state; switching elements $40_1$-$40_{n-1}$ responsive to the control signal 90 are in the conduction state, that is, they transfer the ground level to the inputs $11_1$-$11_{n-1}$; and the tri-state inverter 50 responsive to the control signal 90 feeds back the logic output 80 to the input $11_n$ of the NAND gate 11 to hold the level of the logic output 80.

According to this embodiment, the number of gates through which an input signal passes is reduced from four to two in comparison with the prior art latching circuit shown in FIG. 6. Therefore, the operation speed is increased.

As mentioned above, in the first and second embodiments shown in FIGS. 8 and 9, such latching circuit comprises: a logic operation circuit, namely, NOR gate 10 or NAND gate 11, having N inputs for effecting a predetermined logic operation between the N inputs to produce a logic output (N is a natural number more than one); N first switching elements responsive to the control signal 90 indicative of latching and non-latching modes for connecting N input terminals to the N inputs respectively when the control signal is indicative of the non-latching mode (logic L); a signal producing circuit, namely, the trai-state inverter 50, for producing a signal at an output thereof in response to the logic output; a second switching element for connecting the output of the inverter 50 to the above-mentioned one input ($10_n$ or $11_n$) when the control signal 90 is indicative of the latching mode; and (N−1) third switching elements ($40_1$-$40_{n-1}$) responsive to the control signal 90 for connecting N−1 inputs ($10_n$ or $11_n$) to a logic level the ground level or the supply power voltage respectively when the control signal 90 is indicative of the latching mode. The logic level is determined such that the logic outputs is determined by a logic level of the above-mentioned one input when the control signal is indicative of the latching mode. That is, if the logic circuit is a NOR or OR gate, the logic level is the ground level and if the logic circuit is a NAND or AND gate, the logic level is the supply voltage Vcc. The signal producing circuit produces the signal such that the logic operation circuit holds the logic output when the control signal is indicative of the latching mode. That is, if the logic circuit has inverting operation, such as NAND or NOR, the signal producing circuit comprises an inverter. If the logic circuit is an AND or OR circuit, the signal producing circuit comprises a buffer.

Hereinbelow will be described a third embodiment of this invention with reference to drawings.

Figure 5A:
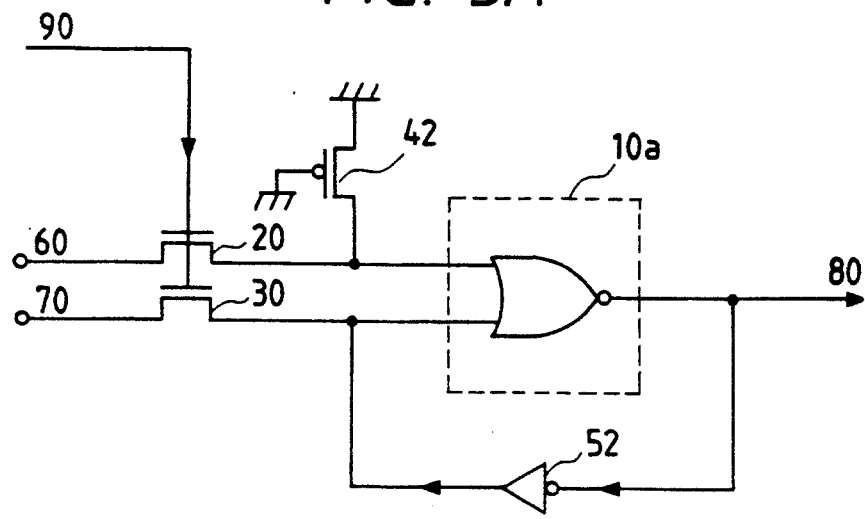
FIGS. 5A and 5B are a schematic circuit diagram of a latching circuit of the third embodiment.

FIG. 5A is a schematic circuit diagram of a latching circuit of the third embodiment.

In FIG. 5A, numeral 10a is a NOR gate for outputting a NOR operation output between first and second input signals from input terminals 60 and 70 at an output 80. Numeral 20 is a first switching element for transferring the first input signal from the first input terminals 60 to a first input of the NOR gate 10a in response to a control signal 90. Similarly, numeral 30 is a second switching element for transferring the second input signal from the second input terminal 70 to a second input of the NOR gate 10a in response to the control signal 90. When the control signal 90 is logic H these switching elements 20 and 30 are in the conduction state. When the control signal 90 is logic L, these switching elements 20 and 30 are open. Numeral 42 is a resistive element (field-effect transistor) for conducting the first input of the NOR gate 10 to the ground level always because the gate of the FET 42 is grounded. That is, the resistive element 42 pulls the level of the first input of the NOR gate 10 down to the ground level. However, the current drive capacity of the resistive element 42 is lower than that of the first switching element 20, so that when the first switching element 20 conducts, the level of the first input of the NOR gate 10a is determined by the logic level of the first input signal from the input terminal 60. In other words, the resistive element 42 has higher resistivity than the switching element 20. Numeral 52 is an inverter for inverting the output 80 of the NOR gate 10a and for sending the result of NOR operation to the second input of the NOR gate 10a. Similar to the resistive element 42, the inverter 52 has a smaller current drive capacity of the inverter 52 than the second switching element 30. When the second switching element 30 is in the conduction state, a level of the second input of the NOR gate 10a is determined by the second input 70.

Hereinbelow will be described operation of the third embodiment.

FIG. 2A shows an equivalent schematic circuit diagram of the latching circuit shown in the FIG. 5A also when the control signal 90 is logic H. In this condition, the latching circuit shown in FIG. 5A can be represented by the equivalent circuit shown in FIG. 2A because the first and second switching elements 20 and 30 are in the conduction state, so that the resistive element 42 and the inverter 52 are negligible. That is, the equivalent circuit shown in FIG. 2A outputs a NOR operation output at the output 80 in response to the first and second inputs from the input terminals 60 and 70.

When the control signal 90 is changed to logic L, the latching circuit shown in FIG. 5A can be shown by the equivalent circuit shown in FIG. 2B because the first and second switching elements 20 and 30 are in the open state and the resistive element 42 and the inverter 52 effects the first and second input of the NOR gate 10, so that the circuit condition changes such that the first input of the NOR gate 10a is connected to the ground and the output of the inverter 52 connected to the second input of the NOR gate 10a. That is, this equivalent circuit holds the result of the Logic operation at the output 80. In other words, a bistable circuit is formed. Therefore, when the control signal 90 is changed into logic L, the latching circuit holds its output level which has been outputted there just before the transition of the control signal 90. That is, the latching circuit of the first embodiment effects NOR operation between the first and second inputs 60 and 70 and latches the result of the NOR operation in response to the control signal.

Figure 5B:
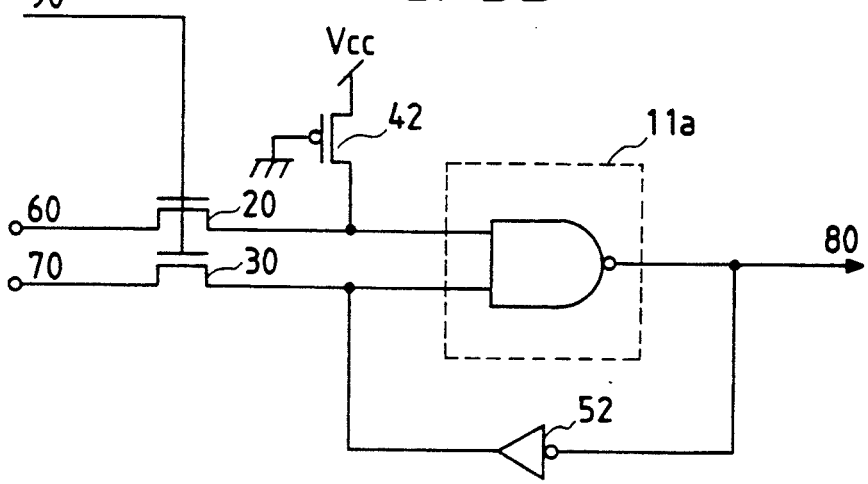

FIG. 5A shows a schematic circuit diagram of a latching circuit of the third embodiment using a NOR gate 10a. On the other hand, FIG. 5B is a block diagram of the third embodiment using a NAND gate 11a. The difference between FIGS. 5A and 5B is in that the NOR gate 10a is replaced with the NAND gate 11a and the switching element 42 is not connected to the ground but to the supply power Vcc.

FIGS. 5A and 5B show basic structures of the second embodiment. That is, the number of the input terminals is two. On the other hand, FIG. 10 shows the case of the latching circuit having N input terminals $60_1$-$60_{-n}$ using a NOR gate 10.

Figure 10:
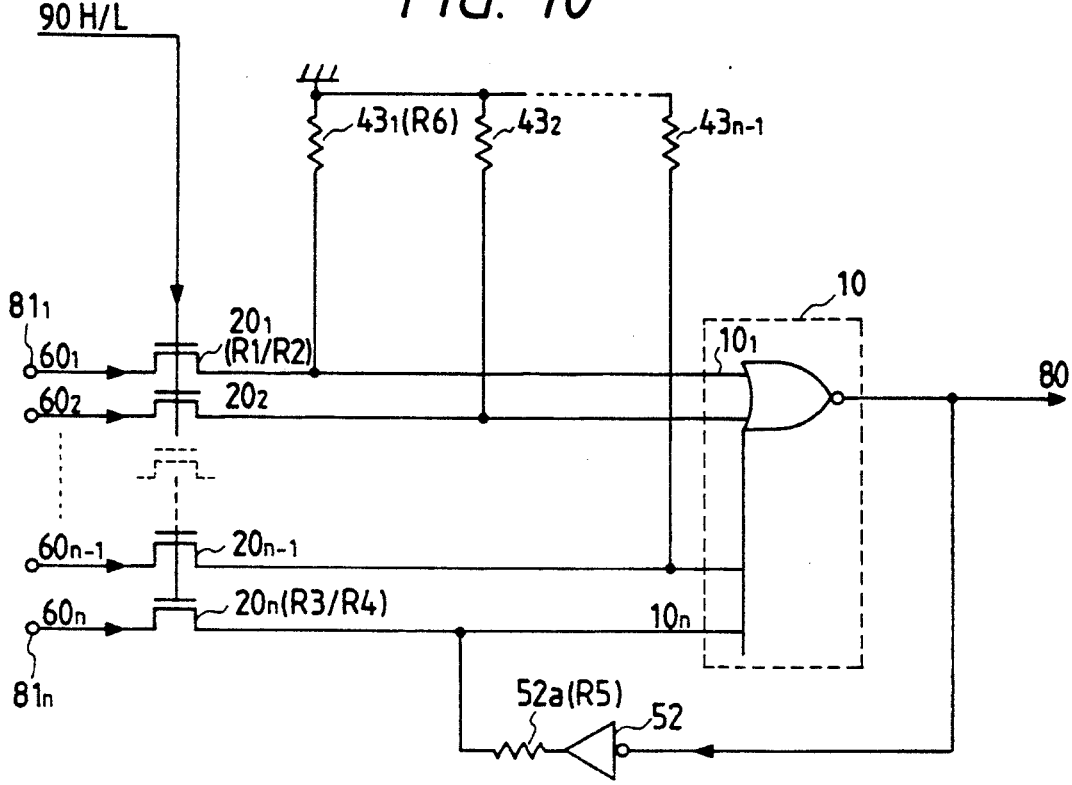
FIG. 10 is a schematic diagram showing a modification of the third embodiment.

In FIG. 10, when the control signal 90 is logic H, the NOR gate 10 effects NOR operation among inputs signals from the N input terminals $60_1$-$60_{-n}$ because switching elements $20_1$-$20_n$ responsive to the control signal 90 are in the conduction state. When the control sign 90 is logic L, the switching elements $20_1$-$20_n$ is in the open state; switching elements $40_1$-$40_{n-1}$ responsive to the control signal 90 are in the conduction state, that is, they ground the inputs $11_1$-$11_{n-1}$; and the inverter 52 responsive to the control signal 90 feeds back the logic output 80 to the input $10_n$ of the NOR gate 10 to hold the level of the logic output 80. In this example of the latching circuit NOR gate 10 is used. However, the NAND gate 11 shown in FIG. 9 can be used also as shown the relation between the latching circuits shown in FIG. 5A and 5B.

As mentioned above, in the third embodiment, the latching circuit comprises: a logic operation circuit, namely NOR gate 10 (or NAND gate 11), having N inputs $10_1$-$10_n$ for effecting a predetermined logic operation, namely NOR operation, between N inputs $10_1$-$10_n$ to produce a logic output 80 (N is a natural number more than one); N switching elements $20_1$-$20_n$ responsive to the control signal 90 indicative of latching and non-latching modes (logic L) for connecting N input terminals $60_1$-$60_n$ to N inputs $10_1$-$10_n$ respectively; the inverter 52 as a feedback circuit having a predetermined output impedance for feeding back the logic output 80 to the input $10_n$; and (N−1) resistive elements $43_1$-$43_{n-1}$ for connecting (N−1) inputs $10_1$-$10_{n-1}$ to a logic level, namely, the ground or a supply power Vcc respectively, each of (N−1) switching elements $20_1$-$20_{n-1}$ respectively connected to (N−1) inputs $10_1$-$10_{n-1}$ having a larger resistance than each of (N−1) resistive elements $43_1$-$43_{n-1}$ when the control signal is indicative of the latching mode, each of (N−1) switching elements $20_1$-$20_{n-1}$ having a smaller resistance than each of (N−1) resistive elements $43_1$-$43_{n-1}$ when the control signal 90 is indicative of non-latching mode. The output resistance R5 is larger than the resistance R4 of one of the switching element connected to the input $10_n$ when the control signal 90 is 0. The output resistance R5 is a smaller than the resistance R3 of one switching element connected to one input when the control signal is 1. The logic level is the supply power Vcc if the logic operation circuit is NAND gate 11. The logic level is the ground level if the logic operation circuit is NOR gate 10.

According to this embodiment, though the latching circuit of this embodiment has the same function with the prior art latching circuit and the NOR gate shown in FIG. 6, the number of gates through which an input signal passes is reduced from four to two in comparison with the prior art latching circuit shown in FIG. 6. Therefore, the operation speed is increased.

Figure 11:
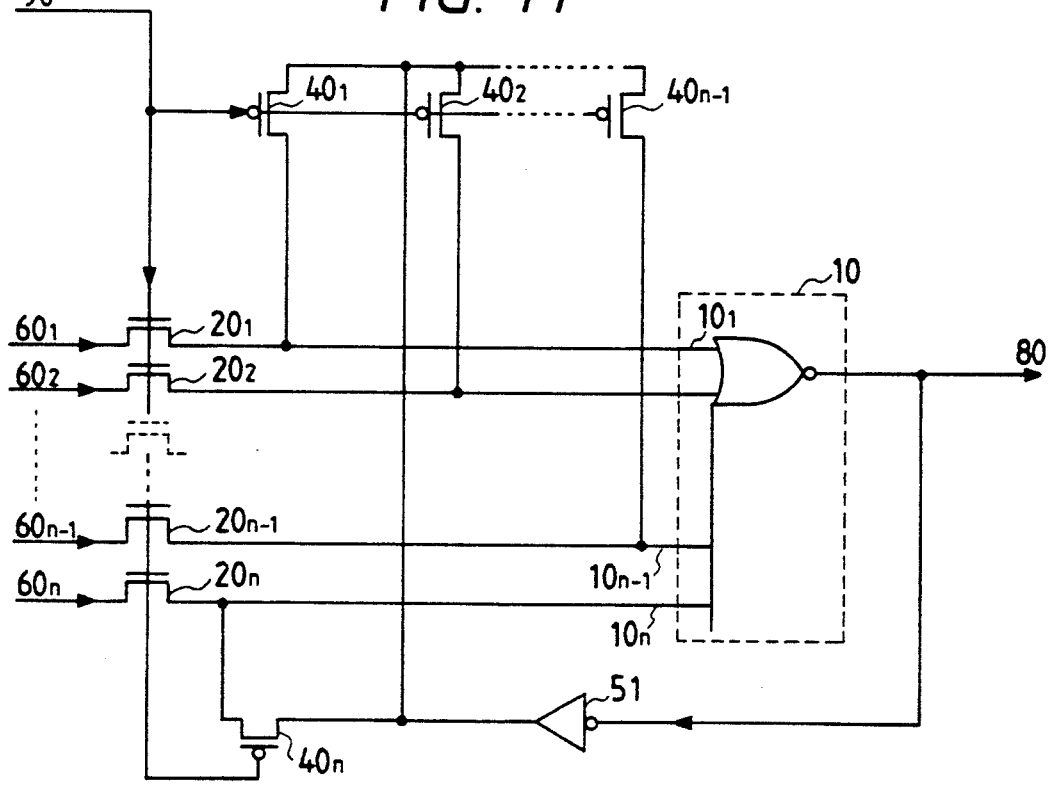
FIG. 11 is a schematic diagram showing a first modified embodiment of the first embodiment.

Hereinbelow will be described a first modified embodiment of the first embodiment with reference to FIG. 11. FIG. 11 is a block diagram of a first modified embodiment. In the latching circuit of the first embodiment shown in FIG. 8, the switching elements $40_1$–$40_{n-1}$ ground inputs $10_1$–$10_{n-1}$ in response to the control signal 90 to hold the logic output. On the other hand, in the first modified embodiment shown in FIG. 11, the the switching elements $40_1$–$40_{n-1}$ connects inputs $10_1$–$10_{n-1}$ to an output of the inverter 51 in response to the control signal 90 to hold the logic output. The tri-state inverter 50 is replaced with the inverter 51 and the FET $40_n$. In this case, the circuit condition of the latching circuit is switched between the ordinary logic operation and the latching condition in response to the control signal 90 as similar to the first embodiment.

Figure 12:
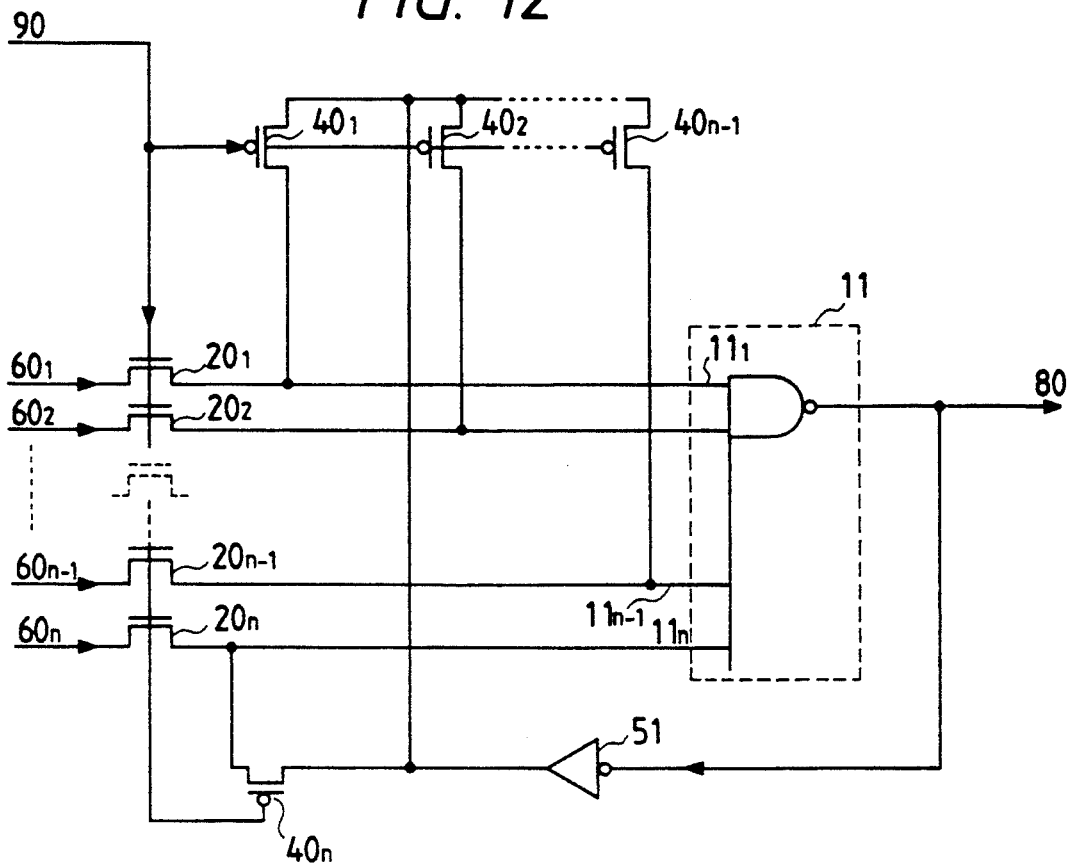
FIG. 12 is a schematic diagram showing a second modified embodiment of the second embodiment.

Hereinbelow will be described a second modified embodiment of the second embodiment with reference to FIG. 12. FIG. 12 is a block diagram of a second modified embodiment. In the latching circuit of the second embodiment shown in FIG. 9, the switching elements $40_1$–$40_{n-1}$ connect inputs $11_1$–$11_{n-1}$ to the supply power Vcc in response to the control signal 90 to hold the logic output. On the other hand, in the second modified embodiment shown in FIG. 12, the the switching elements $40_1$–$40_{n-1}$ connects inputs $11_1$–$11_{n-1}$ to an output of the inverter 51 in response to the control signal 90 to hold the logic output. The tri-state inverter 50 is replaced with the inverter 51 and the FET $40_n$. In this case, the circuit condition of the latching circuit is switched between the ordinary logic operation and the latching condition in response to the control signal 90 as similar to the second embodiment.

Figure 13:
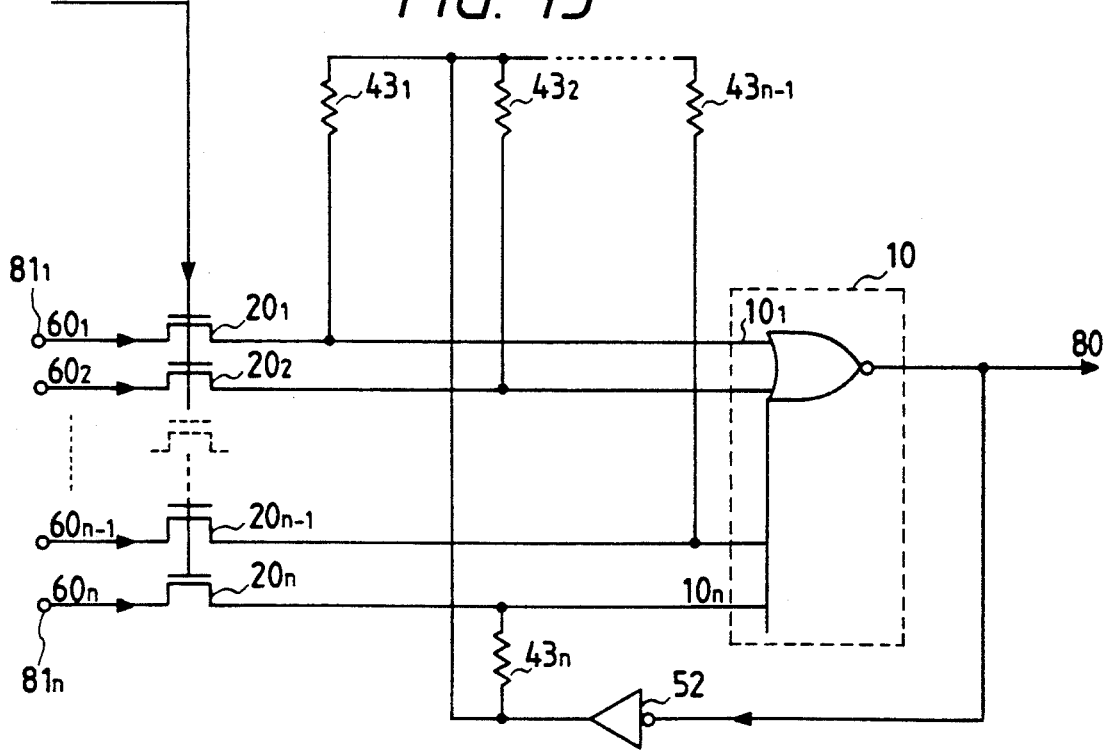
FIG. 13 is a schematic diagram showing a third modified embodiment of the third embodiment.

Hereinbelow will be described a third modified embodiment of the third embodiment with reference to FIG. 13. FIG. 13 is a block diagram of the third modified embodiment. In the latching circuit of the third embodiment shown in FIG. 10, the resistive elements $43_1$–$43_{n-1}$ connect inputs $10_1$–$10_{n-1}$ to the ground in response to the control signal 90 to hold the logic output. On the other hand, in the third modified embodiment shown in FIG. 13, the the switching elements $40_1$–$40_{n-1}$ connect inputs $10_1$–$10_{n-1}$ to an output of the inverter 52 in response to the control signal 90 to hold the logic output. A resistive element $43_n$ connecting an output of the inverter 52 to the input $10_n$ is add. In this case, the circuit condition of the latching circuit is switched between the ordinary logic operation and the latching condition in response to the control signal 90 as similar to the third embodiment.

Hereinbelow will be described other modified embodiment.

Figure 7A:
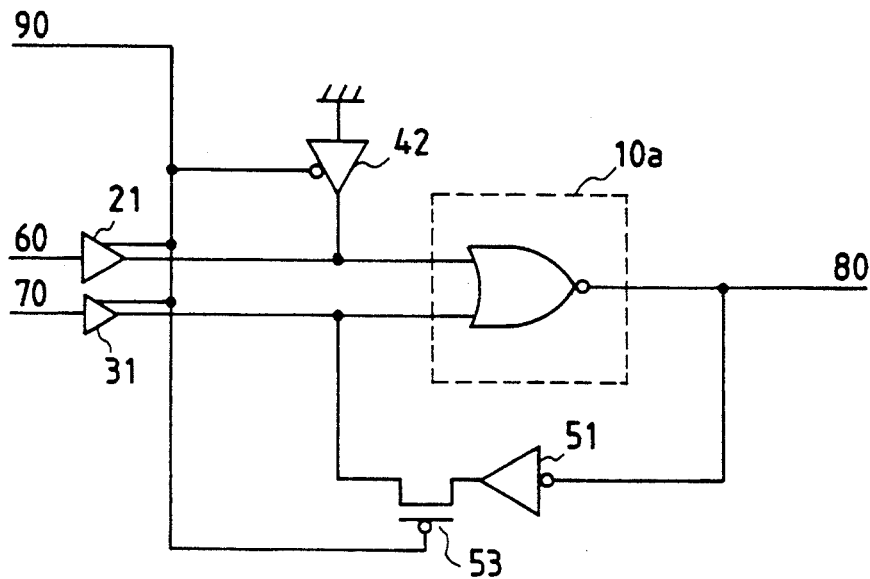
FIGS. 7A and 7B are schematic circuit diagrams of modified embodiments of the first embodiment.
Figure 7B:
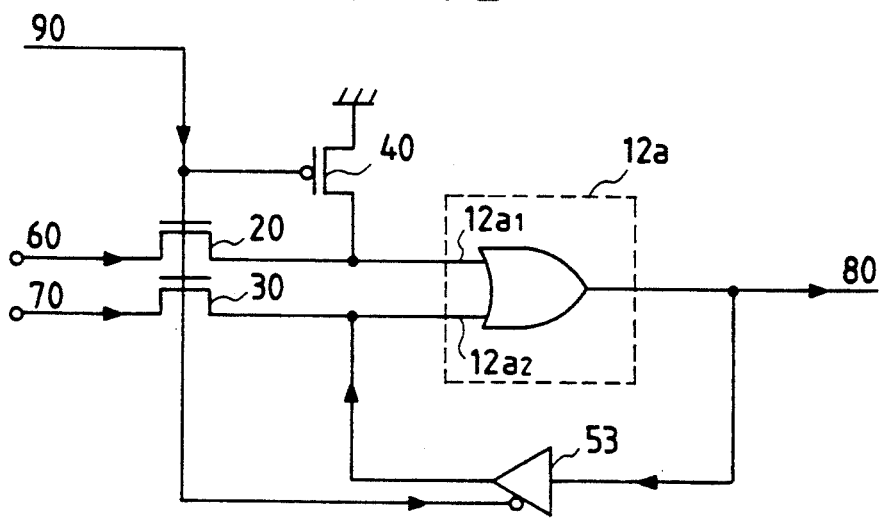

FIGS. 7A and 7B show other modified embodiments of the first embodiment. In FIGS. 1 and 7A, the interconnection of the latching circuit shown in FIG. 7A is the same as that shown in FIG. 1. The switching element 20 is replaced with a tri-state buffer 21. Similarly, the switching element 30 is replaced with a tri-state buffer 31, the switching element 40 is replaced with a tri-state buffer 42. The tri-state inverter 50 is replaced with a inverter 51 and a switching element comprising a field effect transistor 53 connected in series with the inverter 51. The buffer 42 may be replaced with a tri-state buffer responsive to a supply power Vcc. FIG. 7B shows other modified embodiment of the first embodiment also. In FIGS. 1 and 7B, the interconnection of the latching circuit shown in FIG. 7B is the same as that shown in FIG. 1. The difference is that the NOR gate 10a is replaced with a OR gate 12a and the tri-state inverter 50 is replaced with a tri-state buffer 53. The tri-state buffer 53 can be replaced with an FET 40 shown in this drawing. Similarly, the NAND gate 11 can be replaced with a AND gate (not shown). However, a drawing showing such embodiment is omitted because it is clearly understood through embodiments mentioned above.

As mentioned above, elements used in the first embodiment can be replaced with other elements. Similarly, the same modification can be made in the second and third embodiments.

What is claimed is:

1. A latching circuit comprising:
   (a) logic operation means having N inputs for effecting an OR operation between said N inputs to produce a logic output, N being a natural number more than one;
   (b) N first switching means responsive to a control signal indicative of latching and non-latching modes for connecting N input terminals to said N inputs respectively when said control signal is indicative of said non-latching mode;
   (c) second switching means for connecting a line from said logic output to one input of said N inputs when said control signal is indicative of said latching mode; and
   (d) (N − 1) third switching means responsive to said control signal for connecting N − 1 inputs of said N inputs other than said one input to a logic level of "0" respectively when said control signal is indicative of said latching mode.

2. A latching circuit as claimed in claim 1, wherein each of said first switching means comprises a field effect transistor.

3. A latching circuit as claimed in claim 1, wherein each of said third switching means comprises a field effect transistor.

4. A latching circuit as claimed in claim 1, wherein each of said first switching means comprises a tri-state buffer.

5. A latching circuit as claimed in claim 1, wherein each of said third switching means comprises a tri-state buffer.

6. A latching circuit as claimed in claim 1, wherein said logic operation means comprises a NAND gate.

7. A latching circuit as claimed in claim 1, wherein said logic operation means further including a first inverting means for inverting a result of said OR operation to produce said logic output and a second inverting means for inverting said logic output to supply an inverted logic output signal to said one input of said N inputs.

8. A latching circuit comprising:
   (a) logic operation means having N inputs for effecting an OR operation between said N inputs to produce a logic output, N being a natural number more than one;
   (b) N switching means responsive to a control signal indicative of latching and non-latching modes for connecting N input terminals to said N inputs respectively;
   (c) feedback means having a predetermined output resistance for supplying to one input of said N inputs a feedback signal in response to said logic output; and
(d) (N−1) resistive element means for connecting (N−1) inputs of said N inputs other than said one input to a logic level of "0" respectively.

9. A latching circuit as claimed in claim 8, wherein said feedback means comprises an inverter.

10. A latching circuit as claimed in claim 8, wherein said logic operation means further including first inverting means for inverting a result of said OR operation to produce said logic output and said feedback means further including second inverting means for inverting said logic output to produce said feedback signal.

11. A latching circuit comprising:
(a) logic operation means having N inputs for effecting an OR operation between said N inputs to produce a logic output, N being a natural number more than one;
(b) N first switching means responsive to a control signal indicative of latching and non-latching modes for connecting N input terminals to said N inputs respectively when said control signal is indicative of said non-latching mode;
(c) signal producing means for producing a signal at an output thereof in response to said logic output; and
(d) N second switching means for connecting said signal to said N inputs when said control signal is indicative of said latching mode, said signal producing means producing said signal such that said logic operation means holds said logic output when said control signal is indicative of said latching mode.

12. A latching circuit as claimed in claim 11, wherein said logic operation means further including a first inverting means for inverting a result of said OR operation to produce said logic output and a second inverting means for inverting said logic output to supply an inverted logic output signal as said signal to said N second switching means.

13. A latching circuit comprising:
(a) logic operation means having N inputs for effecting an OR operation between said N inputs to produce a logic output, N being a natural number more than one;
(b) N switching means responsive to a control signal indicative of latching and non-latching modes for connecting N input terminals to said N inputs respectively when said control signal is indicative of said non-latching mode;
(c) N resistive element means; and
(d) feedback means for feeding back said logic output to said N inputs through said N resistive element means respectively such that said logic operation means holds said logic output when said control signal is indicative of said latching mode, said N resistive element means having larger resistances than said N first switching means respectively when said control signal is indicative of said non-latching mode.

14. A latching circuit as claimed in claim 13, wherein said resistances of said N resistive element means include an output impedance of said signal producing means respectively and the resistances of said N first switching means include impedances of external signal sources connected to said N first switching means respectively.

15. A latching circuit as claimed in claim 13, wherein said logic operation means further including a first inverting means for inverting a result of said OR operation to produce said logic output and a second inverting means for inverting said logic output to supply an inverted logic output signal to said N resistive element means.

16. A latching circuit comprising:
(a) logic operation means having N inputs for effecting an AND operation between said N inputs to produce a logic output, N being a natural number more than one;
(b) N first switching means responsive to a control signal indicative of latching and non-latching modes for connecting N input terminals to said N inputs respectively when said control signal is indicative of said non-latching mode;
(c) second switching means for connecting a line from said logic output to one input of said N inputs when said control signal is indicative of said latching mode; and
(d) (N−1) third switching means responsive to said control signal for connecting N−1 inputs of said N inputs other than said one input to a logic level of "1" respectively when said control signal is indicative of said latching mode.

17. A latching circuit as claimed in claim 16, wherein said logic operation means further including a first inverting means for inverting a result of said AND operation to produce said logic output and a second inverting means for inverting said logic output to supply an inverted logic output signal to said one input of said N inputs.

18. A latching circuit comprising:
(a) logic operation means having N inputs for effecting an AND operation between said N inputs to produce a logic output, N being a natural number more than one;
(b) N switching means responsive to a control signal indicative of latching and non-latching modes for connecting N input terminals to said N inputs respectively;
(c) feedback means having a predetermined output resistance for supplying to one input of said inputs a feedback signal in response to said logic output; and
(d) (N−1) resistive element means for connecting (N−1) inputs of said N inputs other than said one input to a logic level of "1" respectively.

19. A latching circuit as claimed in claim 18, wherein said logic operation means further including first inverting means for inverting a result of said AND operation to produce said logic output and said feedback means further including second inverting means for inverting said logic output to produce said feedback signal.

20. A latching circuit comprising:
(a) logic operation means having N inputs for effecting an AND operation between said N inputs to produce a logic output, N being a natural number more than one;
(b) N first switching means responsive to a control signal indicative of latching and non-latching modes for connecting N input terminals to said N inputs respectively when said control signal is indicative of said non-latching mode;
(c) signal producing means for producing a signal at an output thereof in response to said logic output; and (d) N second switching means for connecting said output to said N inputs when said control signal is indicative of said latching mode, said signal producing means producing said signal such that said logic operation means holds said logic output when said control signal is indicative of said latching mode.

21. A latching circuit as claimed in claim 20, wherein said logic operation means further including a first inverting means for inverting a result of said AND operation to produce said logic output and a second inverting means for inverting said logic output to supply an inverted logic output signal as said signal to said N second switching means.

22. A latching circuit comprising:
(a) logic operation means having N inputs for effecting an AND operation between said N inputs to produce a logic output, N being a natural number more than one;
(b) N switching means responsive to a control signal indicative of latching and non-latching modes for connecting N input terminals to said N inputs respectively when said control signal is indicative of said non-latching mode;
(c) N resistive element means; and
(d) feedback means for feeding back said logic output to said N inputs through said N resistive element means respectively such that said logic operation means holds said logic output when said control signal is indicative of said latching mode, said N resistive element means having larger resistances than said N first switching means respectively when said control signal is indicative of said non-latching mode.

23. A latching circuit as claimed in claim 22, wherein said logic operation means further including a first inverting means for inverting a result of said AND operation to produce said logic output and a second inverting means for inverting said logic output to supply an inverted logic output signal to said N resistive element means.

24. A latching circuit as claimed in claim 22, wherein said resistances of said N resistive element means include an output impedance of said signal producing means respectively and the resistance of said N first switching means include impedances of external signal sources connected to said N first switching means respectively.

* * * * *